US010412852B1

(12) United States Patent
Tsefrekas et al.

(10) Patent No.: US 10,412,852 B1
(45) Date of Patent: Sep. 10, 2019

(54) MULTI-PIECE STORAGE SHUTTLE

(71) Applicant: EMC IP Holding Company, LLC, Hopkinton, MA (US)

(72) Inventors: Spero Tsefrekas, Shrewsbury, MA (US); Ryan C. McDaniel, Hopkinton, MA (US); Keith C. Johnson, Medway, MA (US); Jeffrey M. Lewis, Maynard, MA (US); Frank Miyahira, San Mateo, CA (US); Keith L. Daly, Shrewsbury, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 50 days.

(21) Appl. No.: 15/488,753

(22) Filed: Apr. 17, 2017

(51) Int. Cl.
*H05K 7/14* (2006.01)
*G06F 1/18* (2006.01)
*H05K 7/18* (2006.01)
*H05F 3/02* (2006.01)
*H01R 33/92* (2006.01)

(52) U.S. Cl.
CPC ........... *H05K 7/1489* (2013.01); *G06F 1/187* (2013.01); *H01R 33/92* (2013.01); *H05F 3/02* (2013.01); *H05K 7/1401* (2013.01); *H05K 7/1454* (2013.01); *H05K 7/1487* (2013.01); *H05K 7/18* (2013.01)

(58) Field of Classification Search
CPC ..... G06F 1/187; H05K 7/1487; H05K 7/1489
See application file for complete search history.

(56) References Cited

U.S. PATENT DOCUMENTS

| | | | | | |
|---|---|---|---|---|---|
| 5,726,922 | A | * | 3/1998 | Womble | G06F 1/184 361/726 |
| 5,793,614 | A | * | 8/1998 | Tollbom | H05K 7/1409 361/725 |
| 5,975,735 | A | * | 11/1999 | Schmitt | G06F 1/184 361/679.31 |
| 5,978,212 | A | * | 11/1999 | Boulay | G06F 1/184 292/19 |
| 6,088,222 | A | * | 7/2000 | Schmitt | E05B 63/143 312/332.1 |
| 6,319,028 | B1 | * | 11/2001 | Zhang | H05K 5/0295 439/159 |
| 7,495,904 | B2 | * | 2/2009 | Liang | G06F 1/187 361/679.39 |
| 7,782,606 | B2 | * | 8/2010 | Baker | G06F 1/187 312/223.1 |
| 8,405,968 | B2 | * | 3/2013 | Chen | H05K 7/14 211/26 |
| 8,611,093 | B2 | * | 12/2013 | Terwilliger | G11B 33/12 312/223.2 |
| 9,437,250 | B2 | * | 9/2016 | Mundt | G11B 33/124 |
| 9,785,206 | B2 | * | 10/2017 | Lo | G06F 1/187 |
| 9,823,714 | B2 | * | 11/2017 | Yang | G06F 1/187 |
| 9,992,904 | B2 | * | 6/2018 | Chen | G11B 33/128 |

(Continued)

*Primary Examiner* — Nidhi Thaker
(74) *Attorney, Agent, or Firm* — Brian J. Colandreo; Mark H. Whittenberger; Holland & Knight LLP

(57) ABSTRACT

A multi-piece storage shuttle for removeably securing a storage device within an enclosure assembly includes a stationary shuttle portion rigidly affixed to the enclosure assembly. A moveable shuttle portion is slidably affixed to the enclosure assembly and is configured to releasably engage the storage device.

17 Claims, 8 Drawing Sheets

(56) References Cited

U.S. PATENT DOCUMENTS

| | | | | |
|---|---|---|---|---|
| 2011/0032670 A1* | 2/2011 | Tsai | ........................ | G06F 1/187 |
| | | | | 361/679.31 |
| 2011/0299237 A1* | 12/2011 | Liang | ................... | G11B 33/128 |
| | | | | 361/679.38 |
| 2015/0043153 A1* | 2/2015 | Zhang | ..................... | G06F 1/187 |
| | | | | 361/679.39 |
| 2017/0228000 A1* | 8/2017 | Yang | ........................ | G06F 1/187 |

* cited by examiner

US 10,412,852 B1

MULTI-PIECE STORAGE SHUTTLE

TECHNICAL FIELD

This disclosure relates to storage shuttles and, more particularly, to multi-piece storage shuttles.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks and need to be serviced in the field. Naturally, the quicker these IT components can be serviced, the less downtime for the IT component.

SUMMARY OF DISCLOSURE

In one implementation, a multi-piece storage shuttle for removeably securing a storage device within an enclosure assembly includes a stationary shuttle portion rigidly affixed to the enclosure assembly. A moveable shuttle portion is slidably affixed to the enclosure assembly and is configured to releasably engage the storage device.

One or more of the following features may be included. The moveable shuttle portion may include a latching assembly configured to releasably affix the moveable shuttle portion at an engaged position within the enclosure assembly. The moveable shuttle portion may be configured to electrically couple the storage device to an electrical connector within the enclosure assembly when the moveable shuttle portion is moved into the engaged position. The moveable shuttle portion may include one or more biasing devices configured to bias the storage device toward the electrical connector within the enclosure assembly when the moveable shuttle portion is moved into the engaged position. The latching assembly may include a lever assembly configured to toggle the moveable shuttle portion between the engaged position and a disengaged position. The moveable shuttle portion may include one or more detent assemblies for releasably holding the moveable shuttle portion in the disengaged position. The moveable shuttle portion may be configured to electrically uncouple the storage device from an electrical connector within the enclosure assembly when the moveable shuttle portion is moved into the disengaged position. The moveable shuttle portion may include one or more storage device engagement surfaces for releasably engaging the storage device and effectuating the electrical uncoupling of the storage device from the electrical connector within the enclosure assembly when the moveable shuttle portion is moved into the disengaged position. The moveable shuttle portion may include one or more grounding assemblies for electrically coupling the moveable shuttle portion with the enclosure assembly. The latching assembly may be electrically conductive; the moveable shuttle portion may be electrically conductive; and the latching assembly may be electrically coupled to the moveable shuttle portion. An electrostatic discharge path may be formed via the combination of the latching assembly, the moveable shuttle portion and the one or more grounding assemblies. The storage device may include an electrical connector for electrically coupling the storage device to an electrical connector within the enclosure assembly. The moveable shuttle portion may include one or more alignment assemblies for aligning the moveable shuttle portion within the enclosure assembly.

In another implementation, a multi-piece storage shuttle for removeably securing a storage device within an enclosure assembly includes a stationary shuttle portion rigidly affixed to the enclosure assembly. A moveable shuttle portion is slidably affixed to the enclosure assembly and configured to releasably engage the storage device. A latching assembly is configured to releasably affix the moveable shuttle portion at an engaged position within the enclosure assembly. The moveable shuttle portion is configured to electrically couple the storage device to an electrical connector within the enclosure assembly when the moveable shuttle portion is moved into the engaged position.

One or more of the following features may be included. The latching assembly may include a lever assembly configured to toggle the moveable shuttle portion between the engaged position and a disengaged position. The moveable shuttle portion may be configured to electrically uncouple the storage device from an electrical connector within the enclosure assembly when the moveable shuttle portion is moved into the disengaged position. The moveable shuttle portion may include one or more storage device engagement surfaces for releasably engaging the storage device and effectuating the electrical uncoupling of the storage device from the electrical connector within the enclosure assembly when the moveable shuttle portion is moved into the disengaged position.

In another implementation, a multi-piece storage shuttle for removeably securing a storage device within an enclosure assembly includes a stationary shuttle portion rigidly affixed to the enclosure assembly. A moveable shuttle portion is slidably affixed to the enclosure assembly and configured to releasably engage the storage device. A latching assembly is configured to releasably affix the moveable shuttle portion at an engaged position within the enclosure assembly, wherein the latching assembly includes a lever assembly configured to toggle the moveable shuttle portion between the engaged position and a disengaged position. The moveable shuttle portion may be configured to: electrically couple the storage device to an electrical connector within the enclosure assembly when the moveable shuttle portion is moved into the engaged position; and electrically uncouple the storage device from the electrical connector within the enclosure assembly when the moveable shuttle portion is moved into the disengaged position.

One or more of the following features may be included. The moveable shuttle portion may include one or more grounding assemblies for electrically coupling the moveable shuttle portion with the enclosure assembly. The latching assembly may be electrically conductive; the moveable shuttle portion may be electrically conductive; and the latching assembly may be electrically coupled to the moveable shuttle portion. An electrostatic discharge path may be formed via the combination of the latching assembly, the moveable shuttle portion and the one or more grounding assemblies.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2; and

Like reference symbols in the various drawings indicate like elements.

DETAILED DESCRIPTION OF THE PREFERRED EMBODIMENTS

Figure 1:
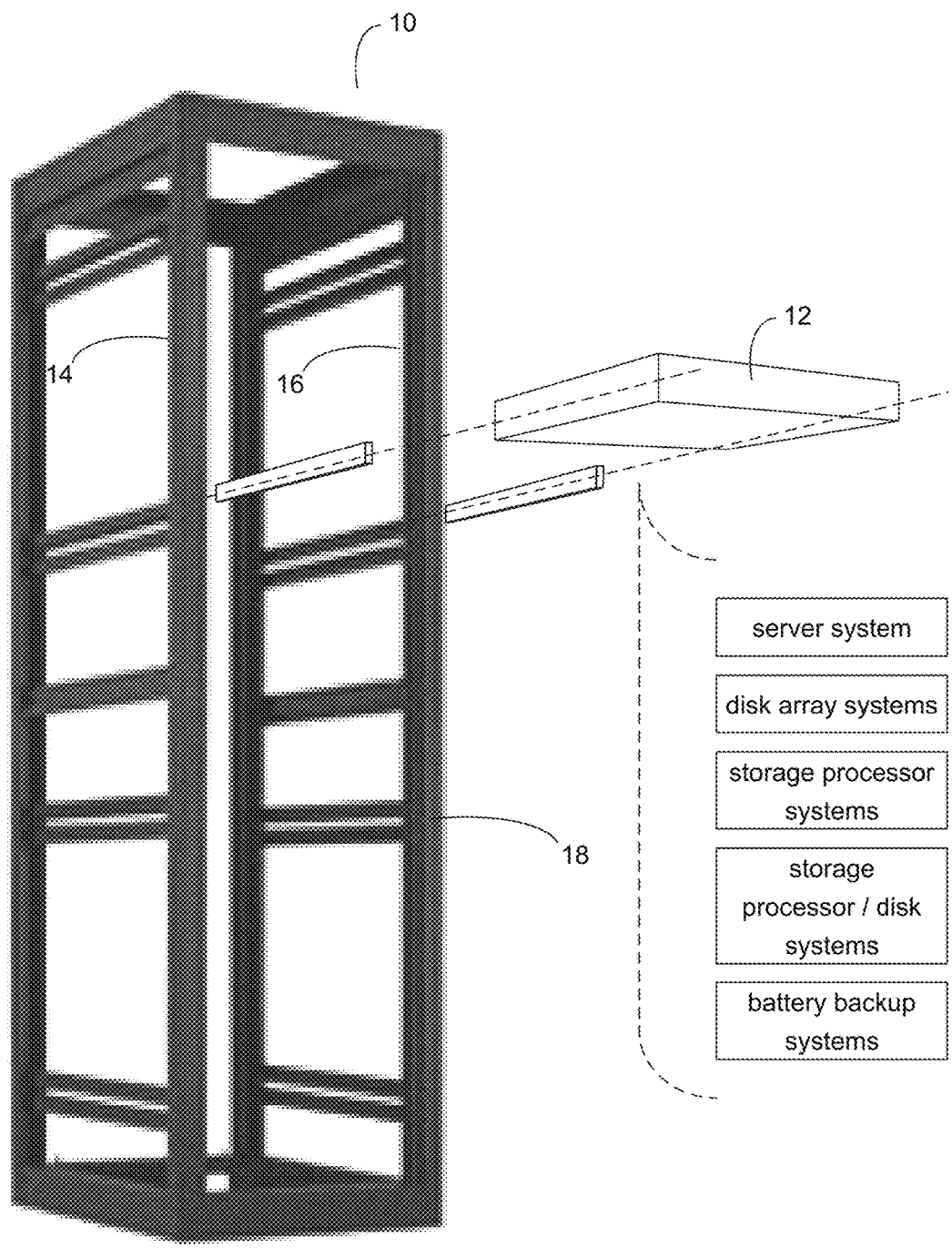
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
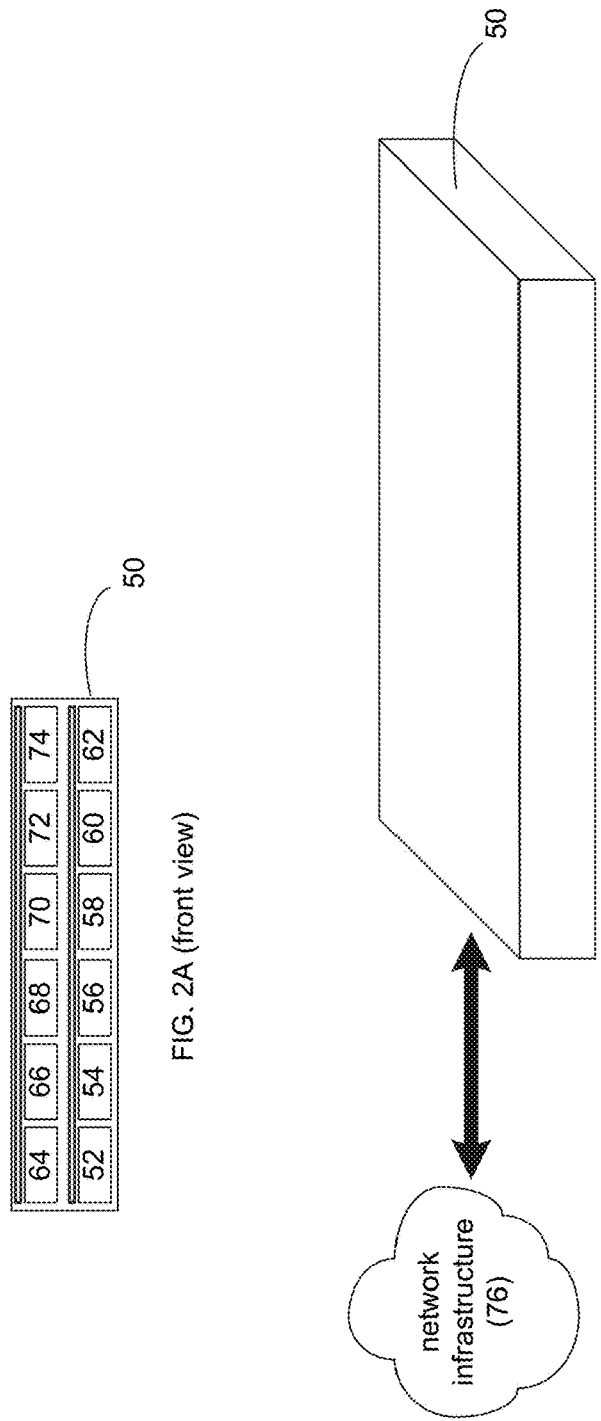
FIG. 2 is a diagrammatic view of a rack-mountable computing device for use within the IT rack of FIG. 1.
Figure 3:
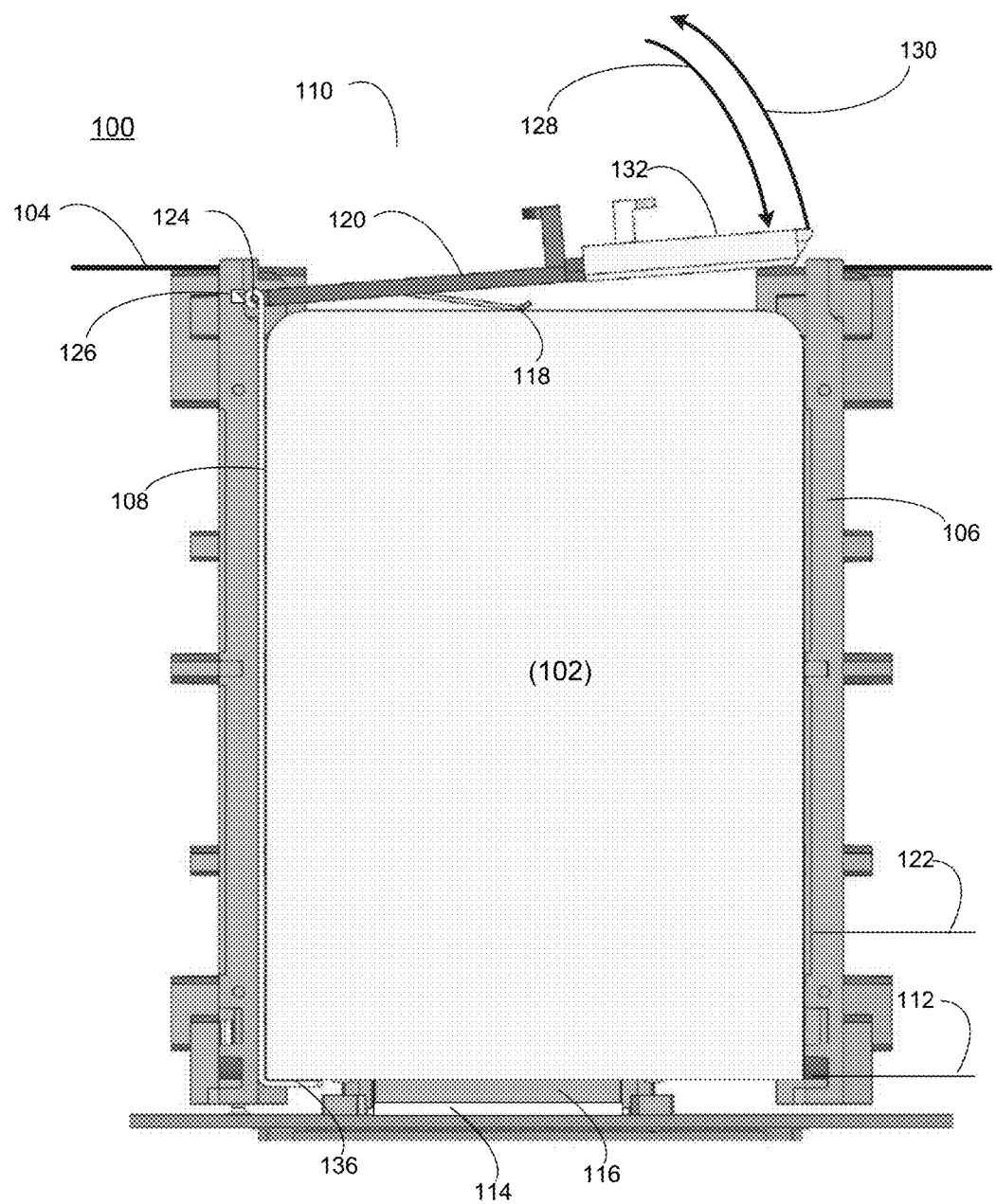
FIGS. 3-8 are diagrammatic views of a multi-piece storage shuttle according to an aspect of this invention.
Figure 4:
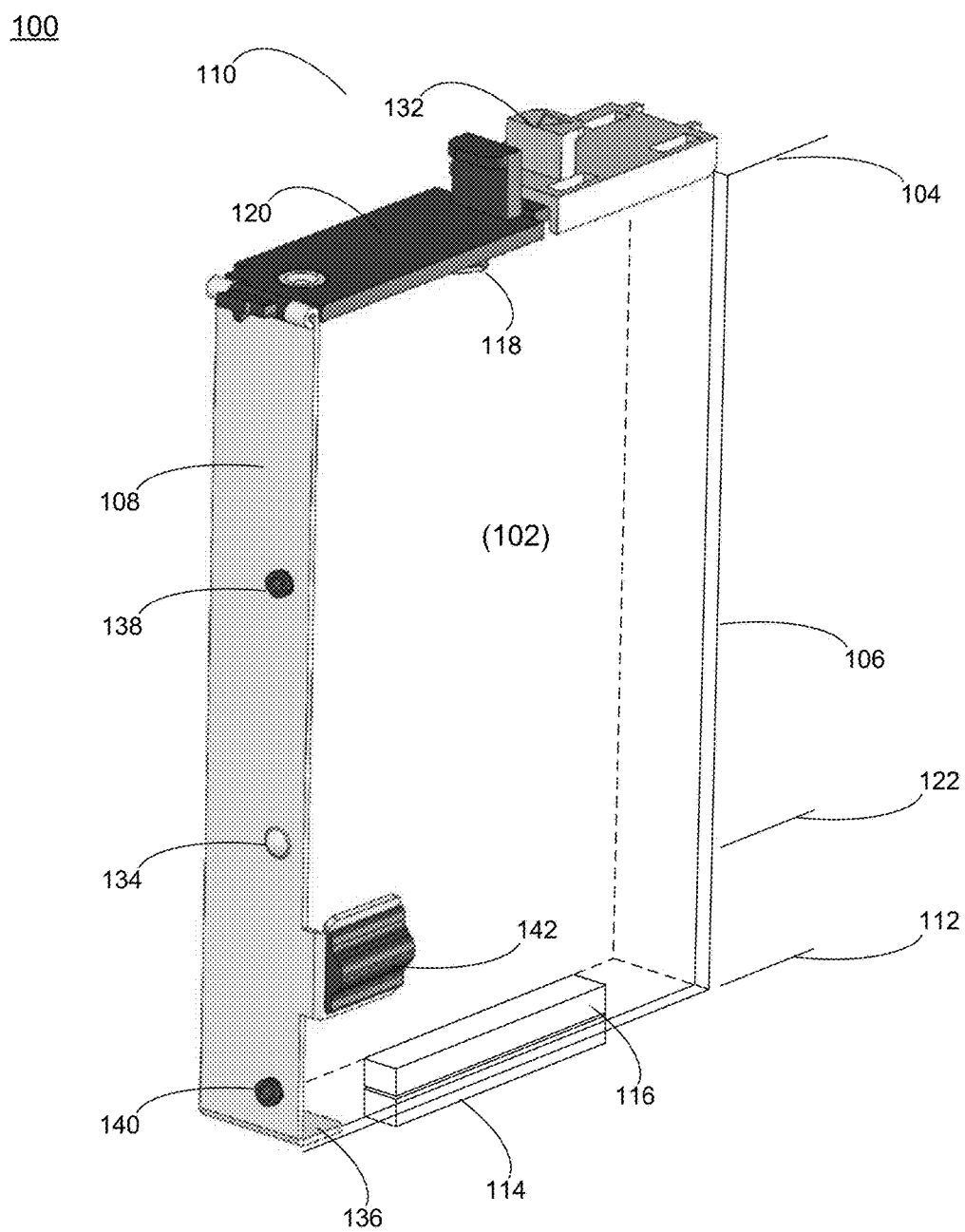
Figure 5:
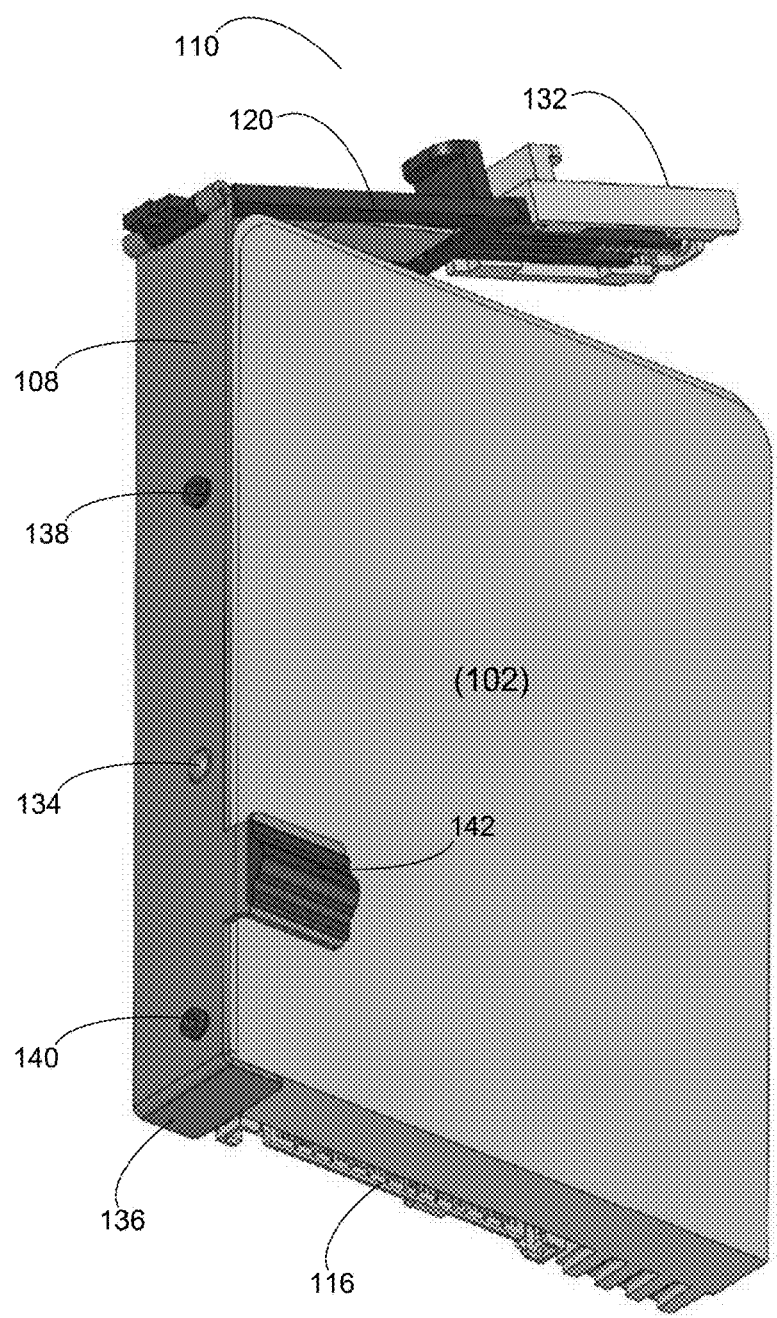
Figure 6:
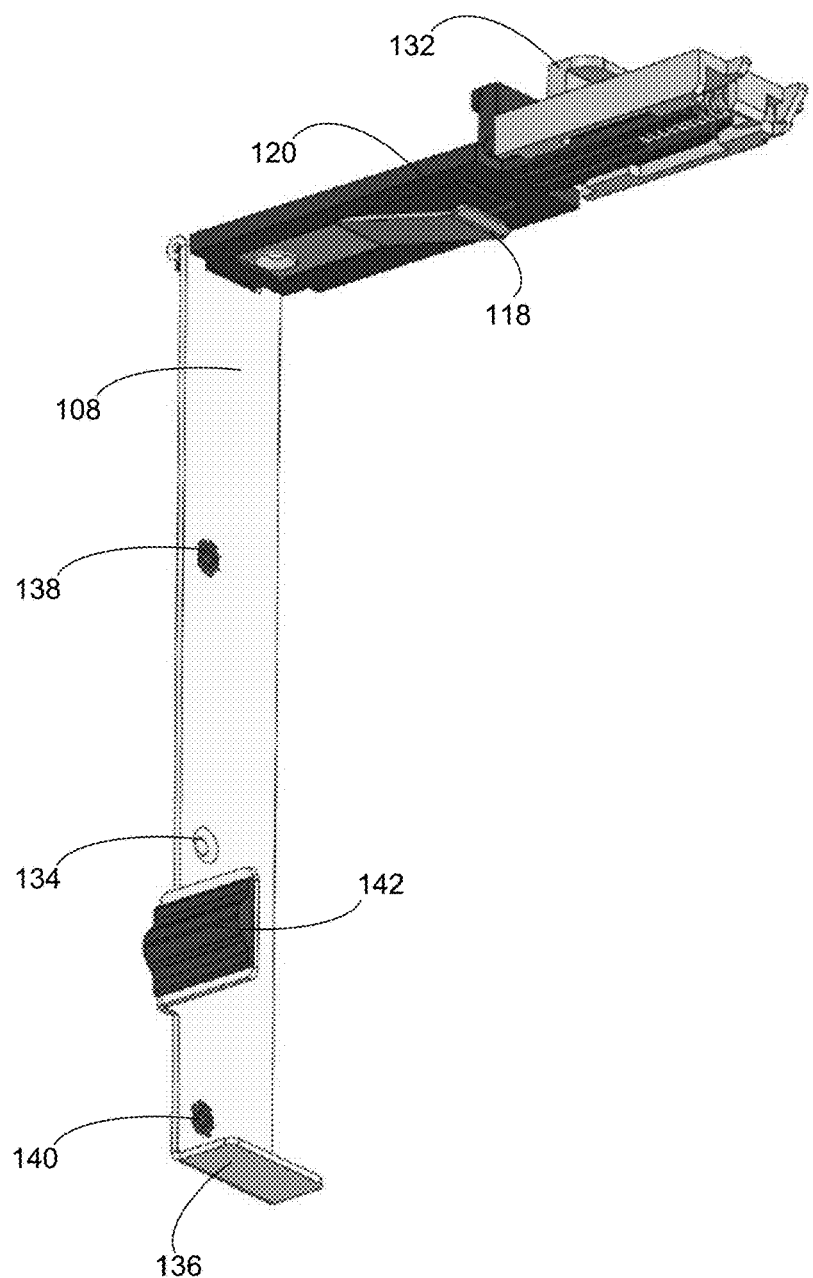
Figure 7:
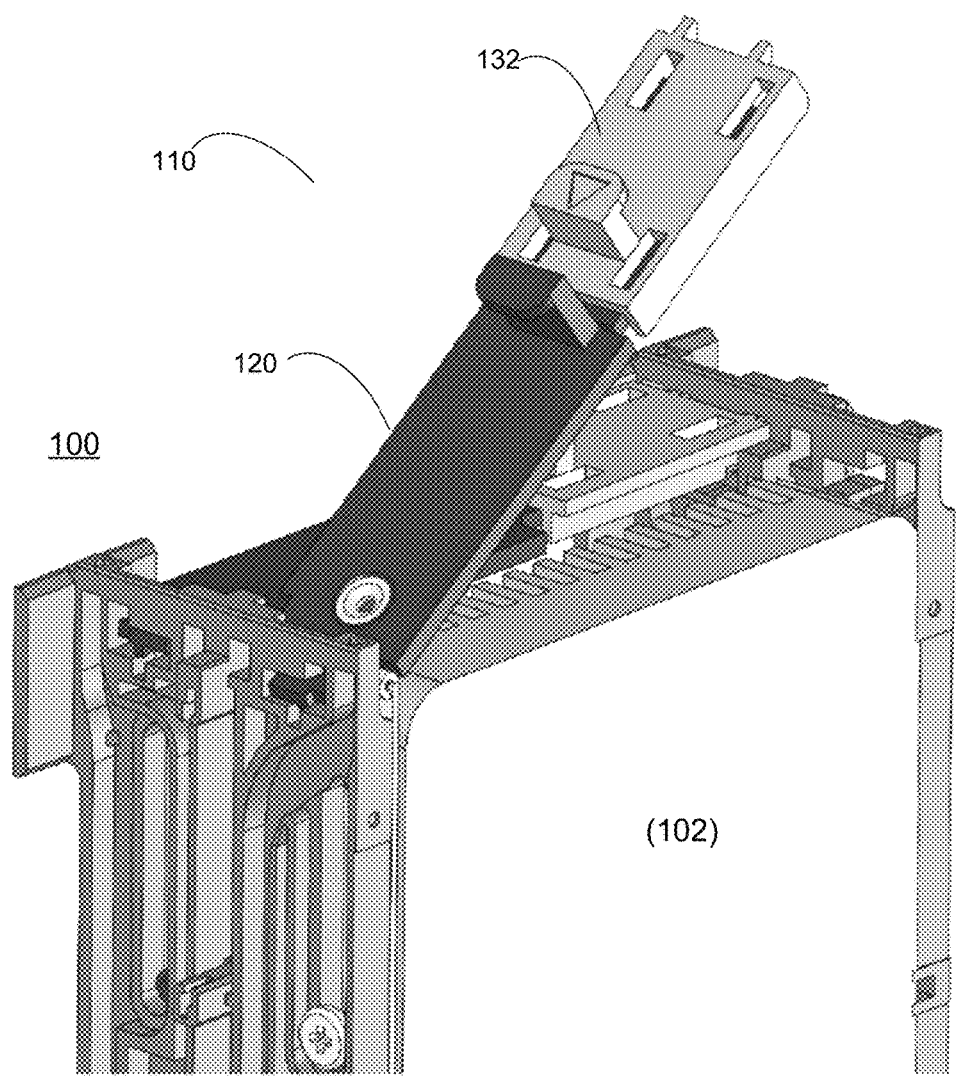
Figure 8:
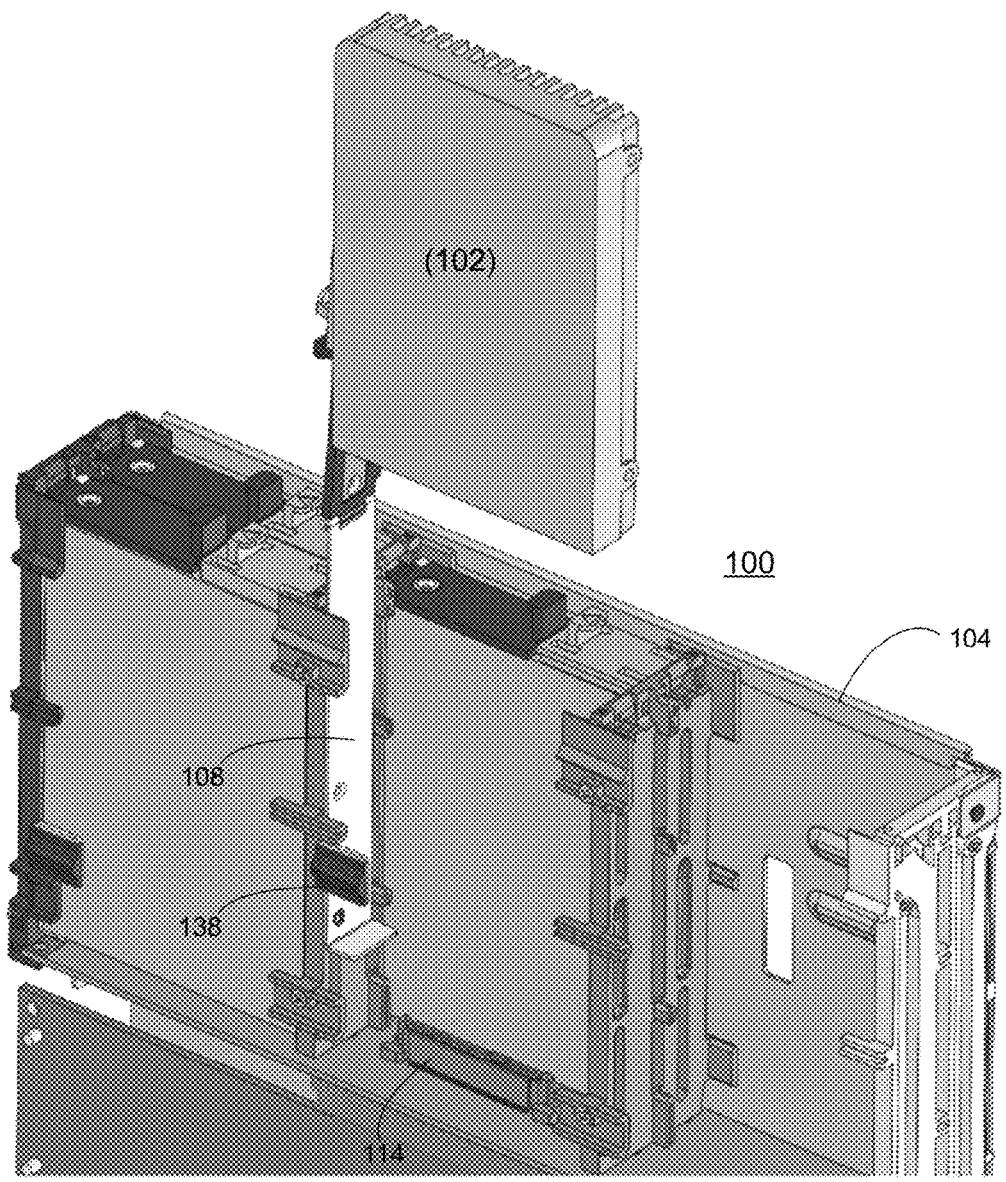

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more rotating-media disk drives (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74).

The input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

The processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

Through the use of rack-mountable computing device 50, rack-mountable computing device 50 may be configured to be easily serviceable in the field by service technicians. Specifically, the storage devices (e.g., storage devices 52, 54, 56, 58, 60, 62, 64, 66, 68, 70, 72, 74) may be configured to be removed and/or installed from rack-mountable computing device 50 without requiring the use of tools.

For example and referring also to FIG. 3-8, there is shown one implementation of multi-piece storage shuttle 100, which may be configured to allow for the easy installation and remove of storage devices from (in this example) rack-mountable computing device 50. While the following discussion concerns multi-piece storage shuttle 100 being utilized within rack-mountable computing device 50, this is for illustrative purposes only and is not intended to be a limitation of this disclosure, as other configurations are possible and are considered to be within the scope of this disclosure. For example, multi-piece storage shuttle 100 may be utilized within commercial-grade, non-rack-mountable computing devices or consumer-grade computing devices.

Multi-piece storage shuttle 100 may be configured to removeably secure a storage device (e.g., storage device 102) within enclosure assembly 104. An example of enclosure assembly 104 may include but is not limited to a chassis, sub-chassis, enclosure, or sub-enclosure (or portion thereof) of rack-mountable computing device 50. Examples of storage device 102 may include one or more of storage devices 52, 54, 56, 58, 60, 62, 64, 66, 68, 70, 72, 74.

Multi-piece storage shuttle 100 may include stationary shuttle portion 106 rigidly affixed to enclosure assembly 104 and moveable shuttle portion 108 slidably affixed to enclosure assembly 104, wherein moveable shuttle portion 108 may be configured to releasably engage storage device 102.

An example of stationary shuttle portion 106 that is rigidly affixed to enclosure assembly 104 may include a frame that is sized to receive the combination of storage device 102 and moveable shuttle portion 108. Specifically, stationary shuttle portion 106 may allow for the combination of storage device 102 and moveable shuttle portion 108 to fit snuggly within (and slide snuggly into) stationary shuttle portion 106, thus allowing for the insertion and removal of storage device 102 into stationary shuttle portion 106 (and, therefore, enclosure assembly 104).

Moveable shuttle portion 108 may include latching assembly 110 configured to releasably affix moveable shuttle portion 108 within enclosure assembly 104 at an engaged position (e.g., engaged position 112). Additionally, moveable shuttle portion 108 may be configured to electrically couple storage device 102 to an electrical connector (e.g., electrical connector 114) within enclosure assembly 104 when moveable shuttle portion 108 is moved into engaged position 112. Storage device 102 may include electrical connector 116 for electrically coupling storage device 102 to electrical connector 114 within enclosure assembly 104.

Moveable shuttle portion 108 may include one or more biasing devices (e.g., biasing device 118) configured to bias storage device 102 toward electrical connector 114 within enclosure assembly 104 when moveable shuttle portion 108 is moved into engaged position 112.

Latching assembly 110 may include lever assembly 120 configured to toggle moveable shuttle portion 108 between engaged position 112 and a disengaged position (e.g., disengaged position 122). Specifically, lever assembly may be configured to pivot about pivot point 124, which will act like a fulcrum. Lever assembly 110 may extend past pivot point 124 and engage recess 126 within stationary shuttle portion 106. Accordingly, when lever assembly 120 is moved in the direction of arrow 128, the upper surface of lever assembly 120 that extends past pivot point 124 engages the upper surface of recess 126, thus driving moveable shuttle portion 108 and storage device 102 into electrical connector 114 and toward engaged position 112.

Moveable shuttle portion 108 may be configured to electrically uncouple storage device 102 from electrical connector 114 within enclosure assembly 104 when moveable shuttle portion 108 is moved into disengaged position 122. For example, when lever assembly 120 is moved in the direction of arrow 130, the lower surface of lever assembly 120 that extends past pivot point 124 engages the lower surface of recess 126, thus driving moveable shuttle portion 108 and storage device 102 away from electrical connector 114 toward disengaged position 122.

Lever assembly 120 may include locking assembly 132 to releasably lock lever assembly 120 in the latched position and, therefore, releasably lock moveable shuttle portion 108 and storage device 102 in engaged position 112. Specifically, locking assembly 132 may be configured to releasable engage a portion of either enclosure assembly 104 or stationary shuttle portion 106 to releasably hold lever assembly 120 proximate storage device 102

Moveable shuttle portion 108 may include one or more detent assemblies (e.g., detent assembly 134) for releasably holding moveable shuttle portion 108 in disengaged position 122. For example, a recess (not shown) may be included within stationary shuttle portion 106 so that when moveable shuttle portion 108 is moved into disengaged position 122, detent assembly 134 engages the recess (not shown) included within stationary shuttle portion 106, thus releasably holding moveable shuttle portion 108 in disengaged position 122.

Moveable shuttle portion 108 may include one or more storage device engagement surfaces (e.g., storage device engagement surface 136) for releasably engaging storage device 102 and effectuating the electrical uncoupling of storage device 102 from electrical connector 114 within enclosure assembly 104 when moveable shuttle portion 108 is moved into disengaged position 122.

Moveable shuttle portion 108 may include one or more alignment assemblies (e.g., alignment assemblies 138, 140) for aligning moveable shuttle portion 108 within enclosure assembly 104. Specifically, alignment assemblies 138, 140 may be configured to slide within one or more longitudinal trough assemblies (not shown) included within stationary shuttle portion 106, thus ensuring proper alignment of electrical connectors 114, 116.

Additionally, moveable shuttle portion 108 may include one or more grounding assemblies (e.g., grounding assembly 142) for electrically coupling moveable shuttle portion 108 with enclosure assembly 104. Additionally, latching assembly 110 may be electrically conductive and moveable shuttle portion 108 may be electrically conductive. Accordingly, latching assembly 110 and/or moveable shuttle portion 108 may be constructed of an electrically conductive material (e.g., steel or aluminum) or may be coated in an electrically conductive material (e.g., through vacuum metallization), wherein latching assembly 110 and moveable shuttle portion 108 may be electrically coupled.

An electrostatic discharge path may be formed via the combination of latching assembly 110, moveable shuttle portion 108 and the one or more grounding assemblies (e.g., grounding assembly 126), thus allowing for the grounding of any electrostatic energy through this discharge path and not through storage device 102. Further, as latching assembly 110 needs to be unlatched prior to the servicing of e.g., storage device 102, the servicer of the system would discharge any electrostatic charge prior to being able to touch storage device 102 and will only be able to touch storage device 12 after it had been uncoupled from electrical connector 114.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A multi-piece storage shuttle for removeably securing a storage device within an enclosure assembly, the multi-piece storage shuttle comprising: a stationary shuttle portion rigidly affixed to the enclosure assembly; and a moveable shuttle portion slidably affixed to the enclosure assembly and configured to releasably engage the storage device, wherein the moveable shuttle portion includes a latching assembly configured to releasably affix the moveable shuttle portion at an engaged position within the enclosure assembly, wherein the latching assembly includes a lever assembly configured to toggle the moveable shuttle portion between the engaged position and a disengaged position, wherein the lever assembly includes: a first portion, wherein the first portion is comprised of an interior surface and an exterior surface, wherein the interior surface of the first portion is comprised of one or more biasing devices configured to engage the storage device and bias the storage device toward an electrical connector within the enclosure assembly when the moveable shuttle portion is moved into the engaged position: and a second portion, wherein the second portion is comprised of: an interior surface and an exterior surface, wherein the interior surface of the second portion is slidably engaged with the first portion at the exterior surface of the first portion; and a locking assembly configured to releasably lock the moveable shuttle portion and the storage device in the engaged position; wherein the second portion forms a terminal end of the moveable shuttle portion and is in contact with the storage device when in the engaged position.

2. The multi-piece storage shuttle of claim 1 wherein the moveable shuttle portion is configured to electrically couple the storage device to the electrical connector within the enclosure assembly when the moveable shuttle portion is moved into the engaged position.

3. The multi-piece storage shuttle of claim 1 wherein the moveable shuttle portion includes:
one or more detent assemblies for releasably holding the moveable shuttle portion in the disengaged position.

4. The multi-piece storage shuttle of claim 1 wherein the moveable shuttle portion is configured to electrically uncouple the storage device from the electrical connector within the enclosure assembly when the moveable shuttle portion is moved into the disengaged position.

5. The multi-piece storage shuttle of claim 4 wherein the moveable shuttle portion includes:
one or more storage device engagement surfaces for releasably engaging the storage device and effectuating the electrical uncoupling of the storage device from the electrical connector within the enclosure assembly when the moveable shuttle portion is moved into the disengaged position.

6. The multi-piece storage shuttle of claim 1 wherein the moveable shuttle portion includes:
one or more grounding assemblies for electrically coupling the moveable shuttle portion with the enclosure assembly.

7. The multi-piece storage shuttle of claim 6 wherein:
the latching assembly is electrically conductive;
the moveable shuttle portion is electrically conductive; and
the latching assembly is electrically coupled to the moveable shuttle portion.

8. The multi-piece storage shuttle of claim 7 wherein an electrostatic discharge path is formed via the combination of the latching assembly, the moveable shuttle portion and the one or more grounding assemblies.

9. The multi-piece storage shuttle of claim 1 wherein the storage device includes: an electrical connector for electrically coupling the storage device to the electrical connector within the enclosure assembly.

10. The multi-piece storage shuttle of claim 1 wherein the moveable shuttle portion includes:
one or more alignment assemblies for aligning the moveable shuttle portion within the enclosure assembly.

11. A multi-piece storage shuttle for removeably securing a storage device within an enclosure assembly, the multi-piece storage shuttle comprising: a stationary shuttle portion rigidly affixed to the enclosure assembly; a moveable shuttle portion slidably affixed to the enclosure assembly and configured to releasably engage the storage device; and a latching assembly configured to releasably affix the moveable shuttle portion at an engaged position within the enclosure assembly, wherein the latching assembly includes a lever assembly configured to toggle the moveable shuttle portion between the engaged position and a disengaged position, wherein the lever assembly includes: a first portion, wherein the first portion includes an interior surface and an exterior surface, wherein the interior surface of the first portion is comprised of one or more biasing devices configured to engage the storage device and bias the storage device toward an electrical connector within the enclosure assembly when the moveable shuttle portion is moved into the engaged position; and a second portion, wherein the second portion is comprised of: an interior surface and an exterior surface, wherein the interior surface of the second portion is slidably engaged with the first portion at the exterior surface of the first portion; and a locking assembly configured to releasably lock the moveable shuttle portion and the storage device in the engaged position; wherein the second portion forms a terminal end of the moveable shuttle portion and is in contact with the storage device when in the engaged position; wherein the moveable shuttle portion is configured to electrically couple the storage device to the electrical connector within the enclosure assembly when the moveable shuttle portion is moved into the engaged position.

12. The multi-piece storage shuttle of claim 11 wherein the moveable shuttle portion is configured to electrically uncouple the storage device from the electrical connector within the enclosure assembly when the moveable shuttle portion is moved into the disengaged position.

13. The multi-piece storage shuttle of claim 12 wherein the moveable shuttle portion includes:
one or more storage device engagement surfaces for releasably engaging the storage device and effectuating the electrical uncoupling of the storage device from the electrical connector within the enclosure assembly when the moveable shuttle portion is moved into the disengaged position.

14. A multi-piece storage shuttle for removeably securing a storage device within an enclosure assembly, the multi-piece storage shuttle comprising: a stationary shuttle portion rigidly affixed to the enclosure assembly; a moveable shuttle portion slidably affixed to the enclosure assembly and configured to releasably engage the storage device; and a latching assembly configured to releasably affix the moveable shuttle portion at an engaged position within the enclosure assembly, wherein the latching assembly includes a lever assembly configured to toggle the moveable shuttle portion between the engaged position and a disengaged position, wherein the lever assembly includes; a first portion, wherein the first portion includes an interior surface and an exterior surface, wherein the interior surface of the first portion is comprised of one or more biasing devices configured to engage the storage device and bias the storage device toward an electrical connector within the enclosure assembly when the moveable shuttle portion is moved into the engaged position; and a second portion, wherein the second portion is comprised of: an interior surface and an exterior surface, wherein the interior surface of the second portion is slidably engaged with the first portion at the exterior surface of the first portion; and a locking assembly configured to releasably lock the moveable shuttle portion and the storage device in the engaged position; wherein the second portion forms a terminal end of the moveable shuttle portion and is in contact with the storage device when in the engaged position; wherein the moveable shuttle portion is configured to: electrically couple the storage device to the electrical connector within the enclosure assembly when the moveable shuttle portion is moved into the engaged position; and electrically uncouple the storage device from the electrical connector within the enclosure assembly when the moveable shuttle portion is moved into the disengaged position.

15. The multi-piece storage shuttle of claim 14 wherein the moveable shuttle portion includes:
   one or more grounding assemblies for electrically coupling the moveable shuttle portion with the enclosure assembly.

16. The multi-piece storage shuttle of claim 15 wherein:
   the latching assembly is electrically conductive;
   the moveable shuttle portion is electrically conductive; and
   the latching assembly is electrically coupled to the moveable shuttle portion.

17. The multi-piece storage shuttle of claim 16 wherein an electrostatic discharge path is formed via the combination of the latching assembly, the moveable shuttle portion and the one or more grounding assemblies.

\* \* \* \* \*